United States Patent [19]

Okano et al.

[11] 4,262,295
[45] Apr. 14, 1981

[54] SEMICONDUCTOR DEVICE

[75] Inventors: Sadao Okano; Hiroaki Hachino; Takuzo Ogawa, all of Hitachi, Japan

[73] Assignee: Hitachi, Ltd., Japan

[21] Appl. No.: 7,819

[22] Filed: Jan. 30, 1979

[30] Foreign Application Priority Data

Jan. 30, 1978 [JP] Japan .................................. 53-9131
Jan. 31, 1978 [JP] Japan .................................. 53-8795

[51] Int. Cl.³ ............................................. H01L 29/90
[52] U.S. Cl. ....................................... 357/13; 357/20; 357/46; 357/57
[58] Field of Search ..................... 357/13, 20, 46, 57

[56] References Cited

U.S. PATENT DOCUMENTS 3,427,509  2/1969  Weisberg ............................... 357/13

Primary Examiner—Edward J. Wojciechowicz
Attorney, Agent, or Firm—Craig & Antonelli

[57] ABSTRACT

A semiconductor device for use as a surge arrester of NPN (or PNP) construction, in which two NPN (or PNP) elements having different avalanche breakdown voltages are so formed that at least the intermediate layers among three layers constituting such sections are continuously connected within the same semiconductive substrate.

Carriers generated in the NPN (or PNP) element, which triggers avalanche at a low voltage, cause the NPN (or PNP) element having a higher avalanche breakdown voltage to be switched to a highly conductive state.

The semiconductor device of the invention provides great surge capacity, and can be used as a surge arrester of increased reliability.

8 Claims, 18 Drawing Figures

SEMICONDUCTOR DEVICE

LIST OF PRIOR ART PUBLICATIONS

"A Silicon Voltage Limiter for Power Thyristor Circuits", Brown Boveri Rev. 9-72, pages 476–482; and U.S. Pat. No. 3,427,509, "Asymmetrical Triggering Diode Composed of Three Opposite Conductivity Regions", H. Weisberg, Issued Feb. 11, 1969.

BACKGROUND OF THE INVENTION

1. Field of the Invention

The present invention relates to a semiconductor device which is particularly suited for use as a surge voltage arrester.

2. Description of the Prior Art

Semiconductor devices used for electric circuits, such as thyristors, transistors, diodes, or integrated circuits composed of their combination, are often equipped with a surge voltage arrester to cope with surge voltages applied from external sources, and a voltage stabilizer element to cope with power-supply voltage fluctuations.

Devices used for these applications must have characteristics such that the resistances (or electric currents) are strikingly varied depending upon the applied voltages when various voltages are applied thereto. Particularly, such devices must have a large derivative of the V-I characteristics when voltages above a predetermined value are applied excellent reproduceability of the V-I characteristics, and a large durability against surge.

Conventional devices having the aforementioned characteristics include varistors that are made of inorganic compounds such as SiC, ZnO, and the like, Zener diodes, and semiconductor devices utilizing the avalanche phenomenon of planar PNP junction construction. A varistor made of an inorganic compound does not have so large a derivative or steep current increase in the V-I characteristics when a surge voltage is applied. Due to its large resistance, therefore, a varistor produces great amounts of heat. A varistor further has a large dispersion of current increase in the V-I characteristics. A Zener diode exhibits a more steep current rise in the V-I characteristics than the varistor. However, it generates large amounts of heat due to its dynamic impedance and provides less durability against surge. A semiconductive arrester of planar PNP junction construction utilizing the avalanche phenomenon has been disclosed, for example, in "A Silicon Voltage Limiter for Power Thyristor Circuits", Brown Boveri Rev., 9-72, pp. 476–482. The above semiconductive arrester is advantageous in that the dispersion of current increase in the V-I characteristics is less than that of varistors made of inorganic compounds. With respect to the current increase in the V-I characteristics and the generation of heat caused by the dynamic impedance, however, the semiconductive arrester has shortcomings similar to those of Zener diodes.

Because of the above-mentioned defects, the rated values of the devices protected by conventional surge voltage arresters have been selected to be considerably higher than the operation voltage of surge voltage arresters, resulting in increased manufacturing costs.

U.S. Pat. No. 3,427,509 describes a prior art device related to the present invention. This United States patent discloses a triggering diode of an N+PN+ (or P+NP+) construction, in which an $N^{30}$ layer has a locally reduced thickness such that the breakdown voltage in the thin portion is decreased as compared with that of other portions, to thereby extinguish the negative resistance characteristics in one direction of the current, in order to obtain an asymmetrical V-I characteristic.

SUMMARY OF THE INVENTION

An object of the present invention is to provide a semiconductive surge arrester having very steep current rising in the V-I characteristics, excellent reproduceability of the V-I characteristics, and great endurance against surge.

According to the present invention, a first feature resides in that the semiconductive surge arrester comprises laminates of three semiconductive layers having alternately different conductivity types, and electrodes covering the outer layers on both sides of the laminates, wherein a first laminate having an avalanche breakdown voltage and a second laminate having an avalanche breakdown voltage higher than that of the first laminate are arranged in a single semiconductive chip in such a manner that at least the intermediate layers of these laminates are continuously connected together.

A second feature resides in that, in addition to the above-said first feature, the second laminate is disposed on the outer circumference of the semiconductive chip.

A third feature resides in that, in addition to the above-said second feature, the thicknesses of the outer layers on both sides of the first laminate and the second laminate are selected to be nearly equal.

Other objects and features of the present invention will become obvious from the following description.

DESCRIPTION OF THE PREFERRED EMBODIMENTS

Figure 1:
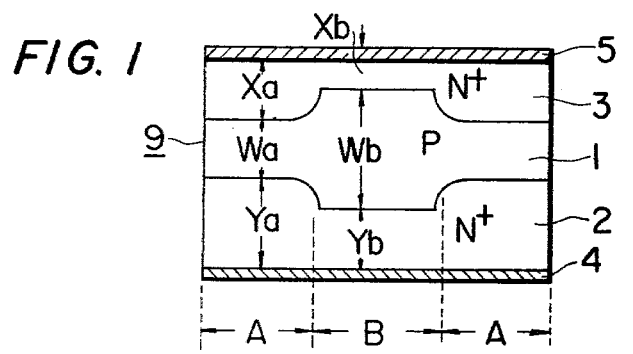
FIG. 1 is a cross-sectional front view of a semiconductor device according to an embodiment of the present invention.

Referring to FIG. 1, a circular or a square chip 9 consists of a base layer 1, an emitter layer 2, a collector layer 3, and electrodes 4 and 5 formed on both surfaces thereof. The central portion constitutes a low-avalanche breakdown voltage region of a three-layered NPN construction having a junction depth Xb, a base layer thickness Wb, and a junction depth Yb. The peripheral region of the chip 9 constitutes a high-avalanche breakdown voltage region of three-layer NPN construction having a junction depth Xa, a base layer thickness Wa, and a junction depth Ya.

Such an arrangement can be produced by using, for example, a P-type semiconductive substrate as a starting material, and forming the N-type layers 2 and 3 by diffusing impurities that form N-type regions from the main surfaces of the substrate by way of thermal diffusion, such that the concentrations of impurities are the same on the main surfaces of the N-type layers 2 and 3, and that the junction depths meet the requirements Xa>Xb and Ya>Yb as shown in FIG. 1. The same holds true in the case of PNP construction where the N-type and P-type are reversed in each of the semiconductor layers. The arrangement of element regions having two different avalanche breakdown voltages can be further materialized by changing the resistivity of the base layer 1 or by other methods. From a standpoint of the manufacturing process, however, the above-said arrangement of element regions should desirably be attained by the above-mentioned method.

Figure 2:
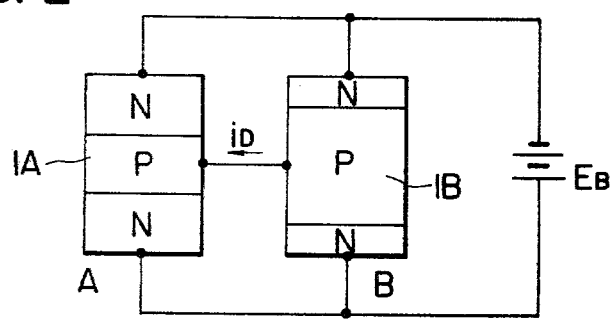
FIG. 2 is a diagram of equivalent circuit to illustrate the operation of the semiconductor device of the present invention.
Figure 3:
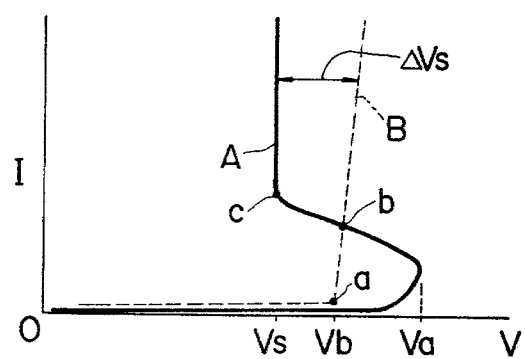
FIG. 3 is schematic graph of the V-I characteristics of the semiconductor device of the present invention.

The operation of the semiconductor device of the present invention is illustrated below with reference to FIGS. 2 and 3. FIG. 2 shows an equivalent circuit of the semiconductor device of the present invention, in which the high-avalanche breakdown voltage region is denoted by A, the low-avalanche breakdown voltage region is denoted by B, and the base layer, emitter, and collector are connected together, and a biasing voltage $E_B$ is applied to both terminals. As the voltage is increased in excess of a voltage Vb at which the transistor junction in the region B develops an avalanche, the carrier is increased in the base layer 1B in the region B causing a current $i_D$ to flow into the base layer 1A in the region A. The current $i_D$ works so as to trigger or promote the switching function of the transistor in the region A. FIG. 3 shows voltage-current characteristics when the two transistors A and B are operated independently of each other. The solid line represents characteristics in the region A, and the dotted line represents characteristics in the region B. The region B should be so designed that the avalanche develops in the base layer 1B. The region A, on the other hand, should be so designed as to work as a transistor which performs the switching function based on the carrier amplified by the avalanche in the base layer 1B as a base current.

As the voltage increases to Vb, the avalanche develops in the base layer 1B in the region B, whereby the carrier in the base layer 1B is amplified causing current to be drastically increased as denoted by a→b in FIG. 3. In this stage, the region A produces neither an avalanche nor a switching function. The carrier amplified in the base 1B diffuses into the base layer 1A. The transistor in the region A is switched at the point b in FIG. 3, and thereafter, a current across the terminals shifts toward a point c on a curve of negative resistance. Here, symbol Vs represents a sustaining voltage of the transistor in the region A. The above-mentioned operation produces V-I characteristics as qualitatively shown in FIG. 4.

The current reaches from the point a to the point c within a very short period of time, and the current rises very steeply after the point c is passed. As a result, a protection operation such as the cut-off of power is quickly performed, enabling power consumption in the semiconductor to be greatly reduced. Accordingly, the capacity to absorb surge energy from external sources is correspondingly increased. It is, therefore possible to lower the rate values of the devices to be protected close to the operation voltage of the protection device.

Figure 5A:
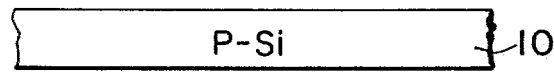
FIGS. 5A–5G show a method of producing the semiconductor device according to the embodiment of the present invention.
Figure 5B:
Figure 5C:
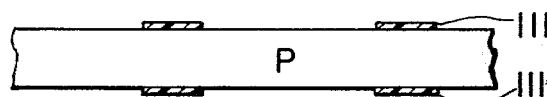
Figure 5D:
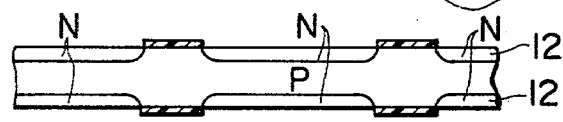
Figure 5E:
Figure 5F:
Figure 5G:
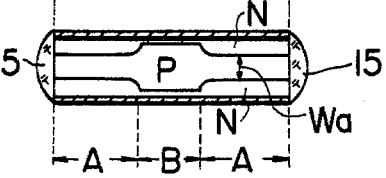

An embodiment of the present invention is described below. The semiconductor device according to the embodiment is manufactured in accordance with the steps shown in FIGS. 5A through 5G. First, a P-type silicon single crystal wafer 10 having a thickness of 215 μm and a resistivity of 1.6 ohms-cm is prepared (FIG. 5A). An $SiO_2$ coating 11 is formed on a pair of main surfaces of the wafer 10 by way of the thermal oxidation (FIG. 5B). The $SiO_2$ coating is selectively removed by way of photoetching to form circular masks 111 of a diameter of 0.6 mm at predetermined positions (FIG. 5C). Phosphorus is diffused from the two main surfaces of the wafer 10 at a temperature of 1250° C. and a surface concentration of $1 \times 10^{20}$ cm$^{-3}$ for about 80 hours to form an N-type semiconductive layer 12 (FIG. 5D). Masks 111 are removed from both surfaces of the wafer 10, and phosphorus is diffused from the two main surfaces of the wafer 10 at a temperature of 1250° C. and a surface concentration of $1 \times 10^{20}$ cm$^{-3}$ for about 30 hours to form an N-type semiconductive layer 13 (FIG. 5E). Aluminum electrodes 14 are formed on the two main surfaces of the wafer 10 by way of the metal vaporization (FIG. 5F). Then, the wafer 10 is cut along the dotted lines of FIG. 5F to obtain many circular chips. The cut surfaces of each chip are coated with a glass 15 to prepare a semiconductor device contemplated by the embodiment of the present invention. The semiconductor device measures about 1.2 mm in chip diameter, about 81 μm in thickness of the N-type semiconductive layer 12, and about 32 μm in thickness of the N-type semiconductive layer 13.

Figure 6:
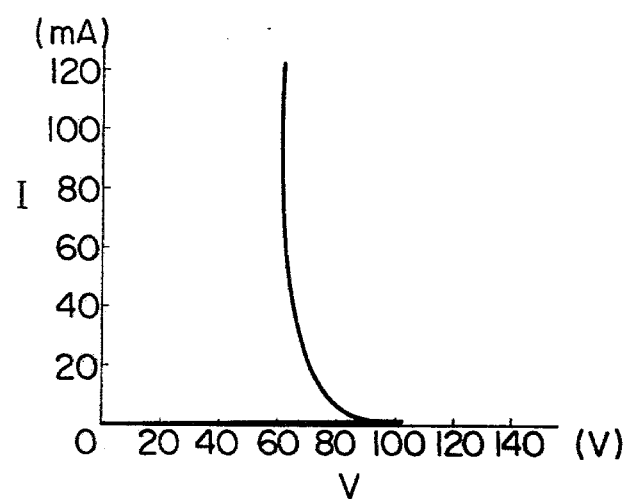
FIG. 6 is a graph showing the V-I characteristics of the semiconductor device according to an embodiment of the present invention.

The surge absorbing ability of the semiconductor device is about two watts when operated continuously, and about 200 kilowatts over a period of 10 μsec. FIG. 6 shows the V-I characteristics of the semiconductor device according to the embodiment within a relatively narrow range of current. This characteristic is symmetric with respect to the origin of the graph, therefore, the other half of the characteristics is not shown.

Figure 4:
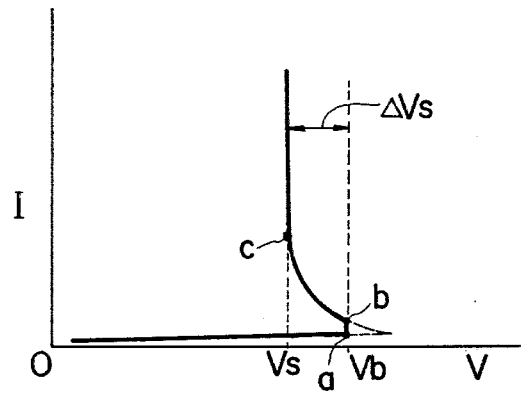
FIG. 4 is a graph which qualitatively shows the V-I characteristics of the semiconductor device according to the embodiment of the present invention.
Figure 7:
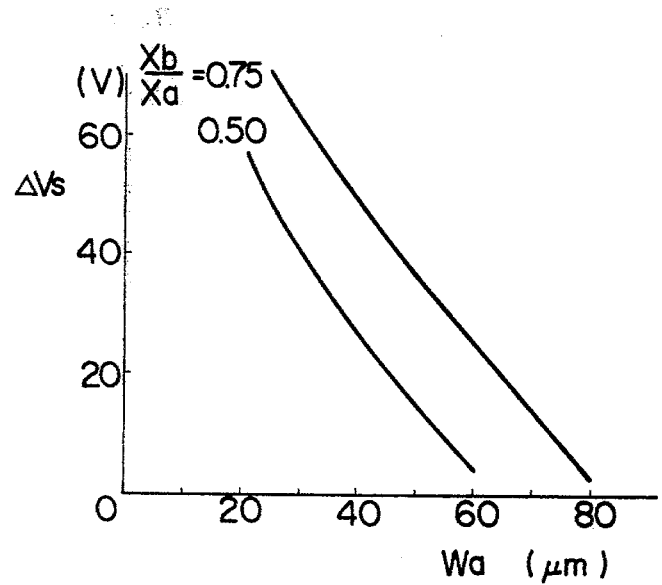
FIG. 7 is a graph showing relations between the thickness Wa of an intermediate layer and ΔVs in the V-I characteristics of the semiconductor device according to an embodiment of the present invention.

FIG. 7 shows the change in ΔVs of FIG. 4 when the thickness Wa of the base layer 1A in the region A is changed, with the ratio of thickness Xb of the collector layer in the region B to the thickness Xa of the collector layer in the region A as a parameter. As shown in the graph of FIG. 7, ΔVs can be changed by suitably selecting the thickness Wa and the ratio Xb/Xa. It is important to suitably select Vs for some applications that will be described later.

The semiconductor device of the present invention may essentially be of NPN construction or PNP construction. As will be explained below, however, it is desirable that the semiconductor device be of NPN construction. According to experiments conducted on the present invention, the device of the NPN construction clearly exhibits a region of negative resistance as indicated by b→c in FIG. 4, thus providing excellent surge absorbing ability, whereas the device of PNP construction exhibits a negative resistance characteristic only weakly. To clarify this fact, the ratio of ΔVs to $V_B$, i.e. $\Delta V_s / V_B = (V_B - V_s)/V_B$ is compared below with reference to the two constructions. The semiconductor devices used for comparison may be prepared using the same steps as in the aforementioned embodiment using boron as an impurity for donating the P-type. Results of the comparison are shown in Table 1, from which it will be seen that the device of NPN construction exhibits a greater $\Delta V_s/V_B$ ratio and stronger negative resistance characteristics than the device of PNP construction.

TABLE 1

| | | | | |
|---|---|---|---|---|
| PNP construction | Wa (μm) | 31.6 | | 93.6 |
| | $\Delta V_s/V_B$ | 0.1 | | 0.02 |
| NPN construction | Wa(μm) | | 53.4 | 150 |
| | $\Delta V_s/V_B$ | | 0.43 | 0.35 |

Figure 8:
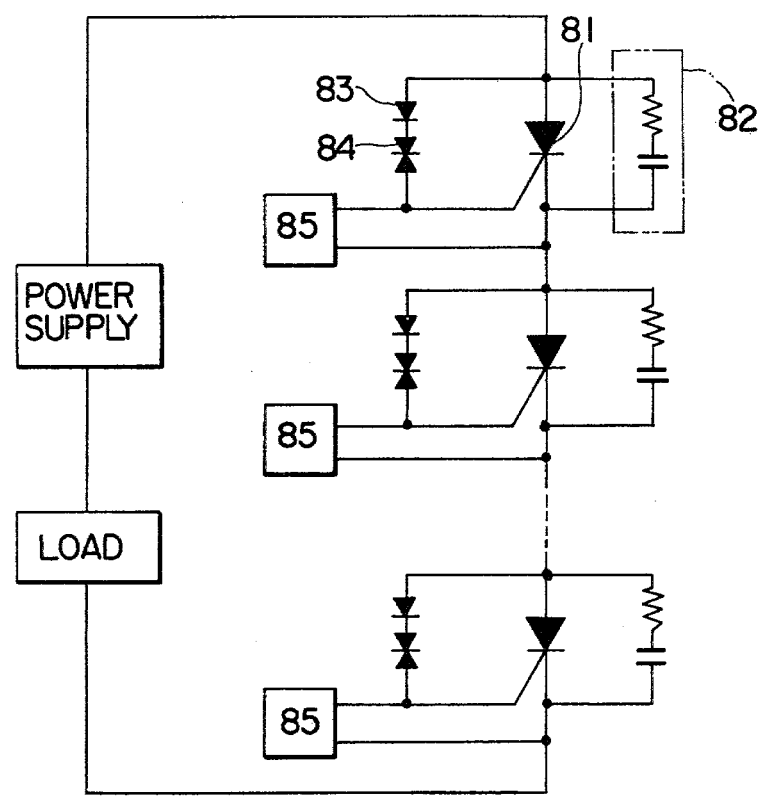
FIG. 8 is a circuit diagram in which the semiconductor device according to an embodiment of the present invention is applied to a circuit for protecting thyristors.

The semiconductor device according to the present invention can usually be used as an overvoltage arrester. A suitable example is described below, utilizing the negative resistance characteristics of the semiconductor device of the present invention in a sophisticated manner. FIG. 8 shows a major portion of the circuit, in which reference numeral 81 denotes a thyristor, 82 a widely known snubber circuit connected between the anode and cathode of the thyristor, 83 a diode, 84 a semiconductor device of the present invention of which one end is connected to the cathode of the diode 83 and of which the other end is connected to the gate of the thyristor, and reference numeral 85 designates a gate control circuit. When a high voltage is applied to a circuit consisting of a plurality of thyristors connected in series as represented in this example, the difference in igniting time among each of the thyristors causes the high voltage to be applied to only those thyristors which are ignited last, so that such thyristors are destroyed. However, using the semiconductor device of the present invention, even when the voltage is applied across the anode and cathode of the thyristor 81 which ignited last, an electric current flows through a by-pass circuit consisting of the anode terminal of the thyristor 81, diode 83, semiconductor device 84 of the present invention, gate terminal of the thyristor 81, thyristor 81, and cathode terminal of the thyristor 81. In addition, at the initial stage of conductivity, the semiconductor device of the present invention exhibits the negative resistance characteristics as shown in FIG. 4. Accordingly, a pulse current caused by $\Delta V_s$ flows across the gate and cathode of the thyristor 81 to render it ignited. Consequently, it is possible to restore the proper operation witout damaging any circuit elements.

According to the embodiment mentioned above, the low-avalanche breakdown voltage region is disposed at the central portion of the chip, and the high-avalanche breakdown voltage region is disposed on the periphery of the chip. In this case, the electric field applied to the junction exposed to the surface of the chip becomes relatively small, permitting easy passivation. The present invention, however, is not limited to only such an arrangement. For instance, a chip of a three-layered construction may be divided into two, such that one side serves as the low-avalanche breakdown voltage region and the other side as the high-avalanche breakdown voltage region, to constitute a switching transistor, producing the same voltage-current characteristics and protecting performance. Further, if the device is so constructed that the emitter and the collector have the same thickness as in the above-mentioned embodiment it is possible to materialize the same protecting performance regardless of the polarity of the surge voltage.

Moreover, if the chip diameter is increased, and the chip is divided into many concentrically arrayed regions such that the high-avalanche breakdown voltage region and the low-avalanche breakdown voltage region are alternately arrayed, it is possible to increase area of current flow and to increase the protecting capacity.

Figure 9:
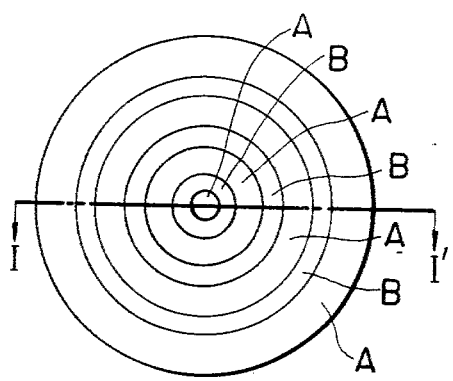
FIGS. 9 through 12 are diagrams showing other embodiments according to the present invention.

FIG. 9 is a plan view showing the above-said embodiment, in which the high-avalanche breakdown voltage regions are denoted by A, and the lower-avalanche breakdown voltage regions are denoted by B.

Figure 10:
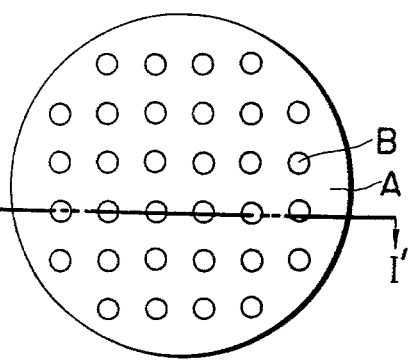
Figure 11:
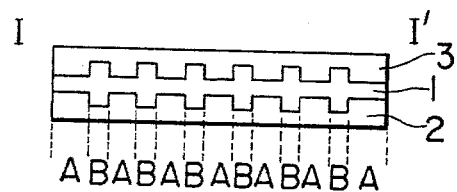

The same object can be achieved even when a plurality of low-avalanche breakdown voltage regions are made present in the chip. FIG. 10 is a plan view showing this embodiment, in which the high-avalanche breakdown voltage regions are denoted by A, and the low-avalanche breakdown voltage regions are denoted by B. FIG. 11 is a cross-sectional view along line I—I' of the above-said chips.

Below, there is described an embodiment to which the present invention is applied. A surge voltage which is practically applied to the surge arrester, i.e. a real surge, is determined by the circuit. Therefore, the required withstand voltage and the withstand capacity vary over wide ranges. In order to make a surge arrester having a high withstand voltage and withstand capacity, the chips obtained by the aforementioned embodiment may be laminated.

Figure 12:
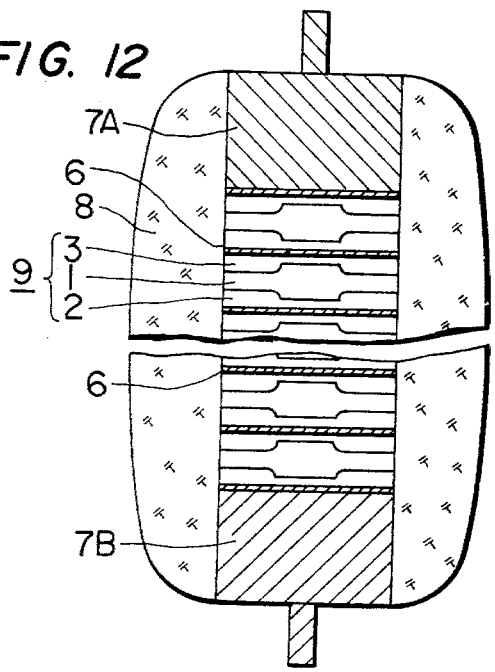

FIG. 12 is a cross-sectional view showing an example in which reference numeral 6 denotes electrode layers inserted between the chips 9, reference numerals 7A and 7B denote upper and lower electrodes, and numeral 8 represents a passivation layer. The thus laminated protector device has a withstand voltage which increases in proportion to the number of the laminated chips, while the voltage and surge remain nearly the same for each chip. In order to increase the capacity against surges, passivation on the junction surfaces must be sufficient. An inorganic glass film may be desirably used as a passivation protector coating. Inorganic glass exhibits a coefficient of thermal expansion close to that of the semiconductor and electrode. A lead glass is desirable when the semiconductor is made of silicon.

While we have shown and described several embodiments in accordance with the present invention, it is understood that the same is not limited thereto but, is susceptible of numerous changes and modifications as known to a person skilled in the art, and we therefore do not wish to be limited to the details shown and described herein but intend to cover all such changes and modifications as are obvious to one of ordinary skill in the art.

What is claimed:
1. A semiconductor device comprising:
   a semiconductive substrate containing a first semiconductor element, which produces an avalanche phenomenon at a predetermined voltage, and a second semiconductor element, which produces an avalanche phenomenon at a voltage higher than that of said first semiconductor element and which produces a negative resistance characteristic, said elements being so formed that an avalanche region of said first semiconductor element is continuously formed with an intermediate layer of the second semiconductor element, each of said first and second semiconductor elements being composed of three semiconductor layers to provide two outer layers and an intermediate layer having alternately different conductivity types; and electrodes formed on a pair of main surfaces of said semiconductive substrate to cover one end of said first semiconductor element and an outer layer on one side of said second semiconductor element, as well as to cover the other end of said first semiconductor element and an outer layer on the other side of said second semiconductor element; and wherein, the thickness of one of the outer layers and the resistivity of the intermediate layer of each of the first and second semiconductor elements are selected in such a manner that the voltage which triggers an avalanche phenomenon of the first semiconductor element is lower than that of the second semiconductor element, and is higher than the minimum value of a sustaining voltage of said second semiconductor element; whereby, in response to a voltage greater than a value that triggers an avalanche phenomenon of the first semiconductor element being applied across said electrodes, carriers flow from the avalanched region of said first semiconductor element into said intermediate layer of said second semiconductor element, thereby causing the second semiconductor element to be switched.

2. A semiconductor device comprising:

a semiconductive substrate having a pair of main surfaces;

a first semiconductor element formed in said semiconductive substrate, and composed of a laminate of three semiconductive layers having alternately different conductivity types, forming PN junctions between adjacent layers, the outer layers on both sides of said laminate being contiguous with said pair of main surfaces, and having a predetermined avalanche breakdown characteristic;

a second semiconductor element formed in said semiconductive substrate, and composed of a laminate of three semiconductive layers having alternately different conductivity types forming PN junctions between adjacent layers, the outer layers on both sides of said laminate being contiguous with said pair of main surfaces, and having another avalanche breakdown characteristic and an intermediate layer of said second semiconductor element being continuously formed with an intermediate layer of said first semiconductor element; and a pair of electrodes formed on said pair of main surfaces of said semiconductive substrate, wherein the thickness of each of the outer layers and the resistivity of the intermediate layer are selected in such a manner that a breakdown voltage of said first semiconductor element is lower than that of said second semiconductor element, and is higher than the minimum value of sustaining voltage of said second semiconductor element, so that negative resistance characteristics are produced in both directions between said pair of electrodes.

3. A semiconductor device according to claim 2, wherein said intermediate layers of said first and second semiconductor elements are made of P-type silicon and the outer layers on both sides thereof are made of N-type silicon.

4. A semiconductor device according to claim 2, wherein the peripheral portion of said semiconductive substrate is composed of said second semiconductor element.

5. A semiconductor device according to claim 2, wherein the concentration of surface impurities of the outer layers adjacent to one main surface of said first and second semiconductor element is constant, and the thickness of said outer layer of said second semiconductor element is greater than the thickness of said outer layer of said first semiconductor element.

6. A semiconductor device according to claim 2, wherein the construction of the semiconductive substrate and the distribution of impurity concentrations are substantially symmetrical with respect to the surfaces located at the center of said pair of main surfaces.

7. A semiconductor surge arrester comprising:

a semiconductive substrate having a pair of main surfaces;

a first semiconductor element formed in said semiconductive substrate, and composed of a laminate of three semiconductive layers having alternately different conductivity types, forming PN junctions between adjacent layers, the outer layers on both sides of said laminate being contiguous with said pair of main surfaces, and having a predetermined avalanche breakdown characteristic;

a second semiconductor element formed in said semiconductive substrate, and composed of a laminate of three semiconductive layers having alternately different conductivity types forming PN junctions between adjacent layers, the outer layers on both sides of said laminate being contiguous with said pair of main surfaces, and having another avalanche breakdown characteristic and an intermediate layer of said second semiconductor element being continuously formed with an intermediate layer of said first semiconductor element; and a pair of electrodes formed on said pair of main surfaces of said semiconductive substrate, wherein the thickness of each of the outer layers and the resistivity of the intermediate layer are selected so that a breakdown voltage of said first semiconductor element is lower than that of said second semiconductor element, and is higher than the minimum value of sustaining voltage of said second semiconductor element, so that negative resistance characteristics are produced in both electrical bias directions between said pair of electrodes so that an electrical surge applied to the electrodes will be arrested regardless of the polarity of the electrical surge.

8. A semiconductor device according to claim 5, wherein the thickness of the intermediate layer of the second semiconductor element is less than the thickness of the intermediate layer of the first semiconductor element.

* * * * *